(12) United States Patent
Hung et al.

(10) Patent No.: US 9,331,171 B2
(45) Date of Patent: May 3, 2016

(54) MANUFACTURING METHOD FOR FORMING SEMICONDUCTOR STRUCTURE

(71) Applicant: UNITED MICROELECTRONICS CORP., Hsin-Chu (TW)

(72) Inventors: Ching-Wen Hung, Tainan (TW); Chih-Sen Huang, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/831,881

(22) Filed: Aug. 21, 2015

(65) Prior Publication Data

US 2015/0357431 A1 Dec. 10, 2015

Related U.S. Application Data

(62) Division of application No. 13/875,293, filed on May 2, 2013, now Pat. No. 9,147,747.

(51) Int. Cl.
| | |
|---|---|
| *H01L 21/336* | (2006.01) |
| *H01L 29/66* | (2006.01) |
| *H01L 29/78* | (2006.01) |
| *H01L 21/768* | (2006.01) |
| *H01L 29/417* | (2006.01) |

(52) U.S. Cl.
CPC ........ *H01L 29/665* (2013.01); *H01L 21/76814* (2013.01); *H01L 21/76879* (2013.01); *H01L 29/41791* (2013.01); *H01L 29/66515* (2013.01); *H01L 29/66795* (2013.01); *H01L 29/785* (2013.01); *H01L 29/7839* (2013.01)

(58) Field of Classification Search
CPC . H01L 51/0072; H01L 51/0067; H01L 51/56; H01L 33/62; H01L 51/5056
USPC .................................. 438/157, 283, 303, 630
See application file for complete search history.

(56) References Cited

U.S. PATENT DOCUMENTS

| | | | |
|---|---|---|---|
| 5,998,873 | A | 12/1999 | Blair |
| 6,043,138 | A | 3/2000 | Ibok |
| 6,492,216 | B1 | 12/2002 | Yeo |
| 6,855,607 | B2 | 2/2005 | Achuthan |
| 6,921,963 | B2 | 7/2005 | Krivokapic |
| 7,013,446 | B2 | 3/2006 | Ohba |
| 7,087,477 | B2 | 8/2006 | Fried |
| 7,091,551 | B1 | 8/2006 | Anderson |
| 7,112,495 | B2 | 9/2006 | Ko |
| 7,214,620 | B2 | 5/2007 | Kim |
| 7,247,887 | B2 | 7/2007 | King |
| 7,250,658 | B2 | 7/2007 | Doris |

(Continued)

*Primary Examiner* — Andy Huynh
(74) *Attorney, Agent, or Firm* — Winston Hsu; Scott Margo

(57) ABSTRACT

The present invention provides a manufacturing method of a semiconductor structure, comprising the following steps. First, a substrate is provided, a first dielectric layer is formed on the substrate, a metal gate is disposed in the first dielectric layer and at least one source/drain region (S/D region) is disposed on two sides of the metal gate, a second dielectric layer is then formed on the first dielectric layer, a first etching process is then performed to form a plurality of first trenches in the first dielectric layer and the second dielectric layer, wherein the first trenches expose each S/D region. Afterwards, a salicide process is performed to form a salicide layer in each first trench, a second etching process is then performed to form a plurality of second trenches in the first dielectric layer and the second dielectric layer, and the second trenches expose the metal gate.

12 Claims, 5 Drawing Sheets

(56) References Cited

U.S. PATENT DOCUMENTS

| | | |
|---|---|---|
| 7,309,626 B2 | 12/2007 | Ieong |
| 7,352,034 B2 | 4/2008 | Booth, Jr. |
| 7,470,570 B2 | 12/2008 | Beintner |
| 7,521,324 B2 | 4/2009 | Ohmi |
| 7,531,437 B2 | 5/2009 | Brask |
| 7,569,857 B2 | 8/2009 | Simon et al. |
| 7,592,270 B2 | 9/2009 | Teo |
| 2004/0195624 A1 | 10/2004 | Liu |
| 2005/0051825 A1 | 3/2005 | Fujiwara |
| 2006/0099830 A1 | 5/2006 | Walther |
| 2006/0286729 A1 | 12/2006 | Kavalieros |
| 2007/0015365 A1 | 1/2007 | Chen |
| 2007/0072376 A1 | 3/2007 | Chen |
| 2007/0108528 A1 | 5/2007 | Anderson |
| 2007/0158756 A1 | 7/2007 | Dreeskornfeld |
| 2007/0218661 A1 | 9/2007 | Shroff |
| 2008/0061366 A1 | 3/2008 | Liu |
| 2008/0157208 A1 | 7/2008 | Fischer |
| 2009/0057759 A1 | 3/2009 | Obradovic |
| 2009/0124097 A1 | 5/2009 | Cheng |
| 2009/0200494 A1 | 8/2009 | Hatem |
| 2009/0236669 A1 | 9/2009 | Chen |
| 2009/0242964 A1 | 10/2009 | Akil |
| 2009/0269916 A1 | 10/2009 | Kang |
| 2010/0019324 A1* | 1/2010 | Ohara ............... H01L 21/28052 257/369 |
| 2010/0040768 A1 | 2/2010 | Dhindsa |
| 2010/0044783 A1 | 2/2010 | Chuang |
| 2010/0048027 A1 | 2/2010 | Cheng |
| 2010/0072553 A1 | 3/2010 | Xu |
| 2010/0129994 A1 | 5/2010 | Awad |
| 2010/0144121 A1 | 6/2010 | Chang |
| 2010/0167506 A1 | 7/2010 | Lin |
| 2010/0270627 A1* | 10/2010 | Chang ............... H01L 21/28247 257/411 |
| 2011/0151635 A1* | 6/2011 | Liu ................... H01L 21/28518 438/301 |
| 2012/0068234 A1 | 3/2012 | Soss |
| 2012/0139061 A1 | 6/2012 | Ramachandran |
| 2013/0154022 A1 | 6/2013 | Chung |
| 2014/0048888 A1 | 2/2014 | Chen |

* cited by examiner

MANUFACTURING METHOD FOR FORMING SEMICONDUCTOR STRUCTURE

CROSS REFERENCE TO RELATED APPLICATIONS

This application is a divisional application of U.S. patent application Ser. No. 13/875,293 filed May 2, 2013, which is herein incorporated by reference in its entirety.

BACKGROUND OF THE INVENTION

1. Field of the Invention

The present invention relates generally to semiconductor manufacturing process, and more specifically, to a method using a hard mask on the metal gate to form contacts structure simultaneously during a plurality of etching processes.

2. Description of the Prior Art

Along with the continuous miniaturization of the Integrated Circuits (IC), the line width of interconnections and the feature size of semiconductor devices have continuously shrunk. In general, discrete devices in integrated circuits are connected to each other through contact plugs (or contact slots) and interconnection structures, and their related fabrication methods have become an important matter in the next-generation semiconductor devices.

In current fabricating processes, due to the limitations of the back end of the line (BEOL) process capacity, the yield of contact plugs with high aspect ratio (HAR) is relatively low and cannot reach the new requirements. In order to overcome this drawback, a double patterning technique, generally including two photolithographic and two etching processes (2P2E) has been invented in order to fabricate required device patterns. Generally, a contact is divided into two parts, a lower contact structure and an upper contact structure (i.e. the metal level zero, M0). After the lower contact structure is formed completely, the M0 is continuously formed. The M0 can be a pole structure or a slot structure. However, since the upper contact structure (M0) and the lower contact structure are formed in different steps, a barrier layer will exist between the upper contact structure (M0) and the lower contact structure, thereby affecting the conductivity of the contact. Besides, the manufacturing process is too complex.

Accordingly, in order to overcome the above-mentioned drawbacks, there is a need to provide a modified method for fabricating interconnection structures with better yields.

SUMMARY OF THE INVENTION

To solve the issues mentioned above, the present invention provides a semiconductor device comprising a substrate, a first dielectric layer disposed on the substrate, a metal gate disposed in the first dielectric layer, a source/drain region (S/D region) disposed on two sides of the metal gate, and a hard mask disposed on the metal gate, wherein the top surface of the hard mask and the top of the first dielectric layer are on the same level.

The present invention further comprises a manufacturing method for forming the semiconductor device at least comprising the following steps: first, a substrate is provided, a first dielectric layer is formed on the substrate, a metal gate is disposed in the first dielectric layer and at least one source/drain region (S/D region) is disposed on two sides of the metal gate; a second dielectric layer is then formed on the first dielectric layer, a first etching process is then performed, to form a plurality of first trenches in the first dielectric layer and the second dielectric layer, wherein the first trenches expose each S/D region. Afterwards, a salicide process is performed to form a salicide layer in each first trench; a second etching process is then performed to form a plurality of second trenches in the first dielectric layer and the second dielectric layer, and the second trenches expose the metal gate.

The present invention further comprises a hard mask on the metal gate, and uses etching gases with different etching rates to selectively etch the hard mask and the dielectric layer disposed above. In this way, the contacts disposed correspondingly to the metal gate and the contacts disposed correspondingly to the S/D region can be formed simultaneously, and replace the $0^{th}$ metal layer (M0) and the lower contact structure in a conventional process, thereby reducing the manufacturing steps.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
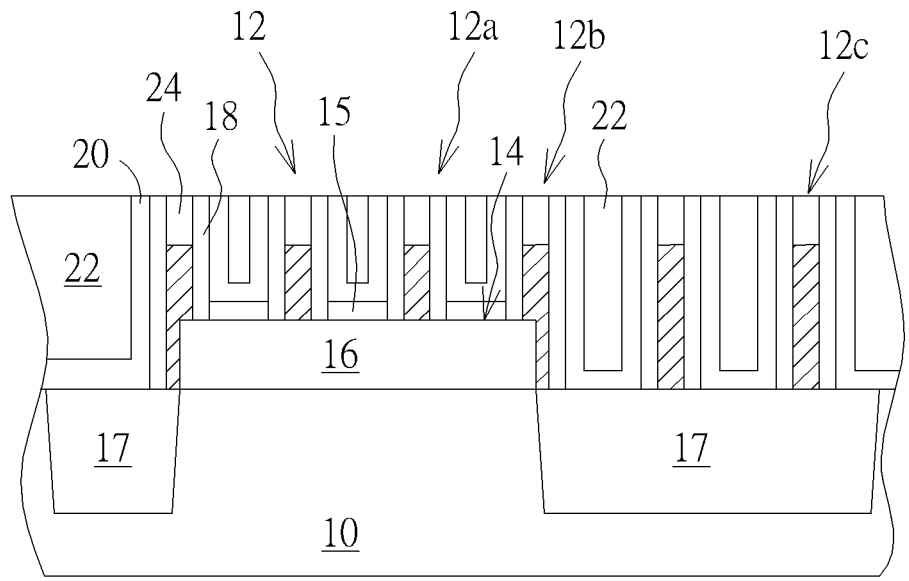
FIGS. 1-9 are schematic diagrams illustrating a manufacturing method of the FinFET semiconductor device according to a first preferred embodiment of the present invention.

Please refer to FIGS. 1-9 are schematic diagrams illustrating a manufacturing method of the FinFET semiconductor device according to a first preferred embodiment of the present invention. As shown in FIG. 1, a substrate 10 is first provided, wherein the substrate 10 comprises at least one metal gate 12 disposed on the substrate 10 and at least one source/drain region (S/D region) 14 disposed on two sides of the metal gate 12. Besides, the substrate 10 selectively comprises at least one fin structure 16. In this embodiment, the metal gate 12 comprises metal materials, the S/D region 14 can be formed on two sides of the metal gate 12 of the substrate 10 through an ion implantation process, or formed on the fin structure 16 disposed on two sides of the metal gate 12. The method of the present invention further comprises forming at least one shallow trench isolation (STI) 17 in the substrate 10 surrounding the metal gate 12, to isolate the metal gate 12 from the fin structures 16 and others electric elements on the substrate 10. In this embodiment, the metal gate may cross the fin structure disposed on the substrate 10 (such as the metal gate 12a shown in FIG. 1), or be disposed on the STI 17 (such as the metal gate 12c shown in FIG. 1) and be used as a dummy gate, or may disposed on the edge of the fin structure 16 to protect the fin structure 16 (such as the metal gate 12b shown in FIG. 1).

In addition, the method of the present invention further comprises selectively forming an epoxy layer 15 on the S/D region 14. Afterwards, a spacer 18 and a contact etching stop layer (CESL) 20 may be formed on two sides of the metal gate 12. A first dielectric layer 22 is then formed on the substrate 10, and a planarization process is then performed, such as a chemical mechanical polishing (CMP), to have the top surface of the metal gate 12 and the top surface of the first dielectric layer 22 on the same level. It is worth noting that in this embodiment, an etching process is performed after the metal gate 12 is completed, to remove parts of the metal gate 12, and a hard mask 24 is then formed to replace the upper portion of the metal gate 12. Another planarization process is then performed to remove the extra hard mask 24. In other words, in the present embodiment, a hard mask 24 is disposed on the top of the metal gate 12, and the top surface of the hard mask 24 and the top surface of the first dielectric layer 22 are on the same level. Besides, since the hard mask 24 replaces some top portion of the metal gate 12, the hard mask 24 is therefore disposed only on the metal gate 12, and disposed between the spacers 18. In addition, since parts of the spacer 18 and parts of the CESL 20 are removed during another planarization process, so the spacer 18 and the CESL 20 have a truncated top surface. In the present embodiment, the spacer 18, the CESL 20 and the hard mask 24 mainly comprise silicon nitride, and the first dielectric layer 22 mainly comprises silicon oxide, but not limited thereto. These elements and the manufacturing methods thereof are well known to persons of ordinary skills in the art and the details will not be described here.

Figure 2:
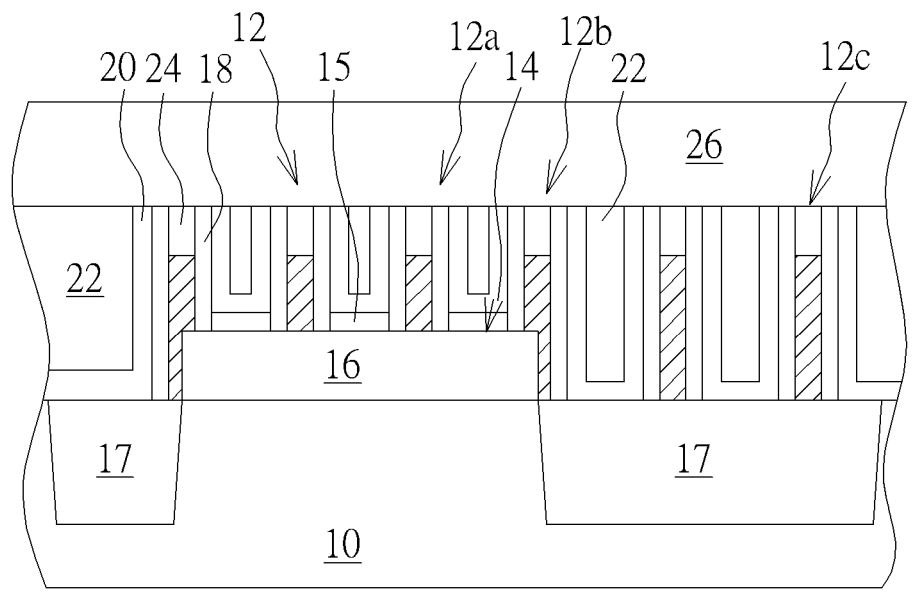

As shown in FIG. 2, a second dielectric layer 26 is then formed on the first dielectric layer 22. According to the preferred embodiment, the photoresist layer 28 sequentially includes an organic dielectric layer (ODL) 28a, a silicon-containing hard mask bottom anti-reflecting coating (SHB) 28b and a photoresist (PR) layer 28c. In short, the photoresist layer 28 is a tri-layer structure consisting of an ODL/SHB/PR structure, but not limited thereto. Afterwards, in order to form the metal plug that is electrically connected to the S/D region 14 (wherein the metal plug can replace the M0 and the lower contacts structure electrically connected to the S/D region in conventional process, denoted here as the $0^{th}$ metal contact, M0CT), a photo-etching process is performed to pattern the photoresist layer 28c and to form a plurality of openings 30, wherein each opening 30 is at least disposed correspondingly to the S/D region 14 disposed below, but not limited thereto. Parts of the openings 30 may be disposed correspondingly to the STI 17 surrounding the metal gate 12 to reduce the pattern density difference between the region including the transistor (mainly comprising the metal gate 12, the S/D region 14 and the fin structure 16) and the periphery region.

Figure 3:
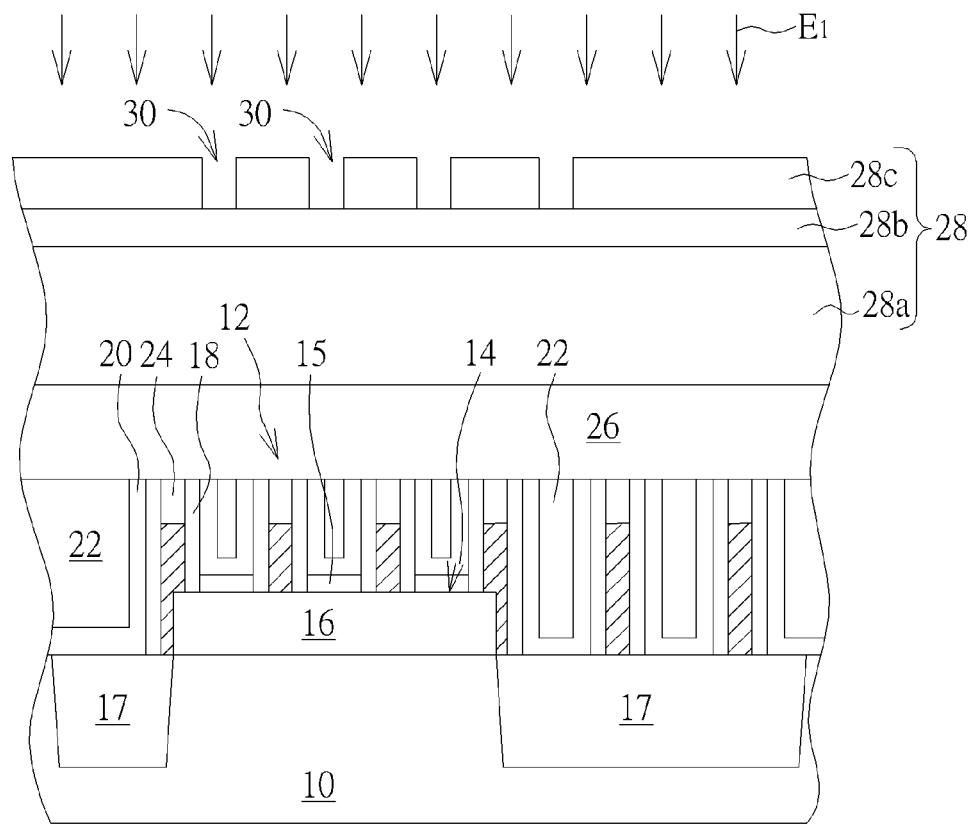
Figure 4:
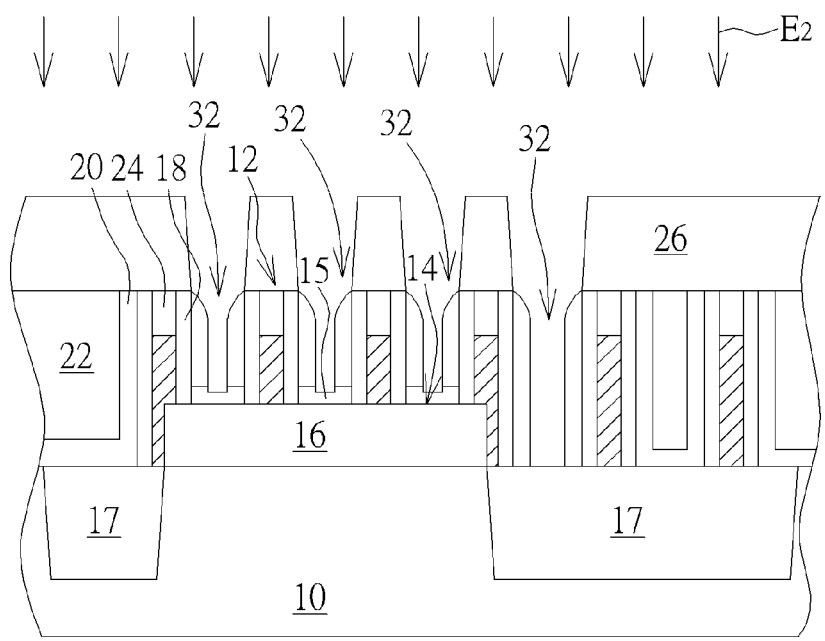

Afterwards, as shown in FIGS. 3-4, at least one etching process E1 is performed to transfer the pattern to others layer disposed below, wherein the etching process E1 comprises: from top to bottom, etching the SHB 28b, the ODL 28a, the second dielectric layer 26 and the first dielectric layer 22 in sequence, until exposing the CESL 20. As shown in FIG. 4, another etching process E2 is then performed, parts of the CESL 20 are removed to expose the epoxy layer 15 disposed below and to form a plurality of first trenches 32, wherein each first trench 32 exposes the epoxy layer 15. It is worth noting that since the epoxy layer is selectively formed, each first trench 32 may therefore directly expose the S/D region 14. Besides, according to different embodiments, parts of the first trenches 32 may be disposed on STI 17.

The etching process of the present invention uses etching gases, which may comprise per fluorocarbon gases, such as tetrafluoromethane (CF4), fluoroform (CHF3), hexafluoride-1,3+butadiene (C4F6), and further comprises oxygen and argon, but not limited thereto. It is worth noting that the higher the ratio of per fluorocarbon gases to oxygen in the etching gas is, the higher the selectivity of the silicon nitride to silicon oxide will be. In other words, the more per fluorocarbon gases are present in the etching gas, the faster the etching rate will be for etching the silicon nitride, compared with the etching rate for etching the silicon oxide. In this embodiment, the main material of the first dielectric layer 22 and the second dielectric layer 26 is silicon oxide, the main material of the CESL 20 is silicon nitride, and the etching gas in etching process E1 is a high selectivity gas (to silicon nitride and silicon oxide), and the selectivity is preferably larger than 5, so the etching rate for etching the second dielectric layer 26 and etching the first dielectric layer 22 will be relatively fast, but the etching rate for etching the CESL 20 is relatively slow when the etching process E1 is performed. The etching rate for etching the second dielectric layer 26 and etching the first dielectric layer 22 is at least five times higher than the etching rate for etching the CESL 20, so the CESL 20 is not easily etched trough during the etching process E1, and the etching will stop on the surface of the CESL 20. Afterwards, the etching gas is adjusted for the etching process E2, and the CESL 20 disposed on the bottom of the first trenches 32 will be removed during the etching process E2.

Figure 5:
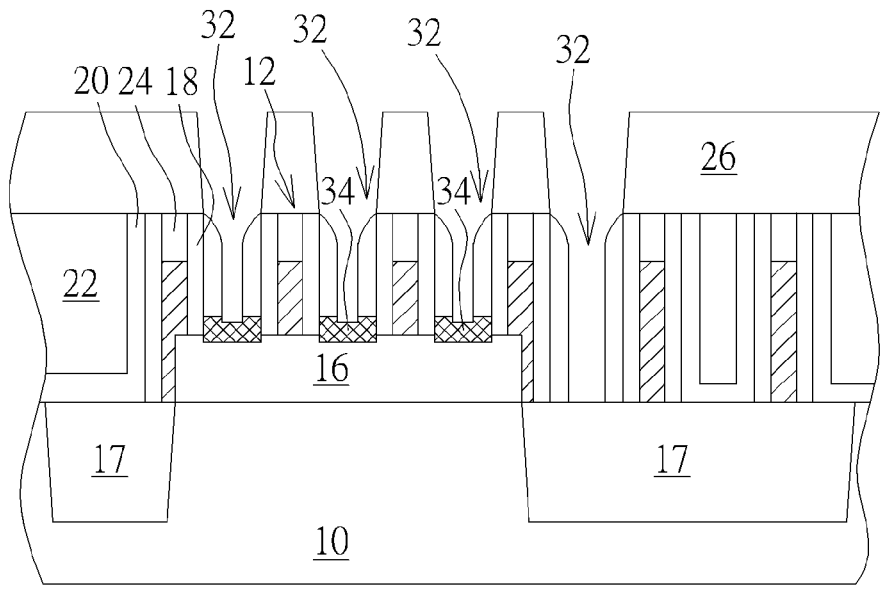

As shown in FIG. 5, a salicide (self-aligned silicide) process is performed to the epoxy layer 15 to form a salicide layer 34 on the bottom of the first trenches 32. The salicide process mainly comprises filling a metal layer (not shown) in each first trench 32, and a thermal process is then performed to form a salicide layer 34 on the interface between the metal layer and the silicon-containing surface. Afterwards, the metal layer disposed in the first trenches 32 is removed. It is worth noting that since the salicide layer 34 is only formed on the silicon-containing surface, it may therefore be formed on the fin structure 16, on the epoxy layer 15 or on the substrate 10, but will not be formed on the STI 17.

Figure 6:
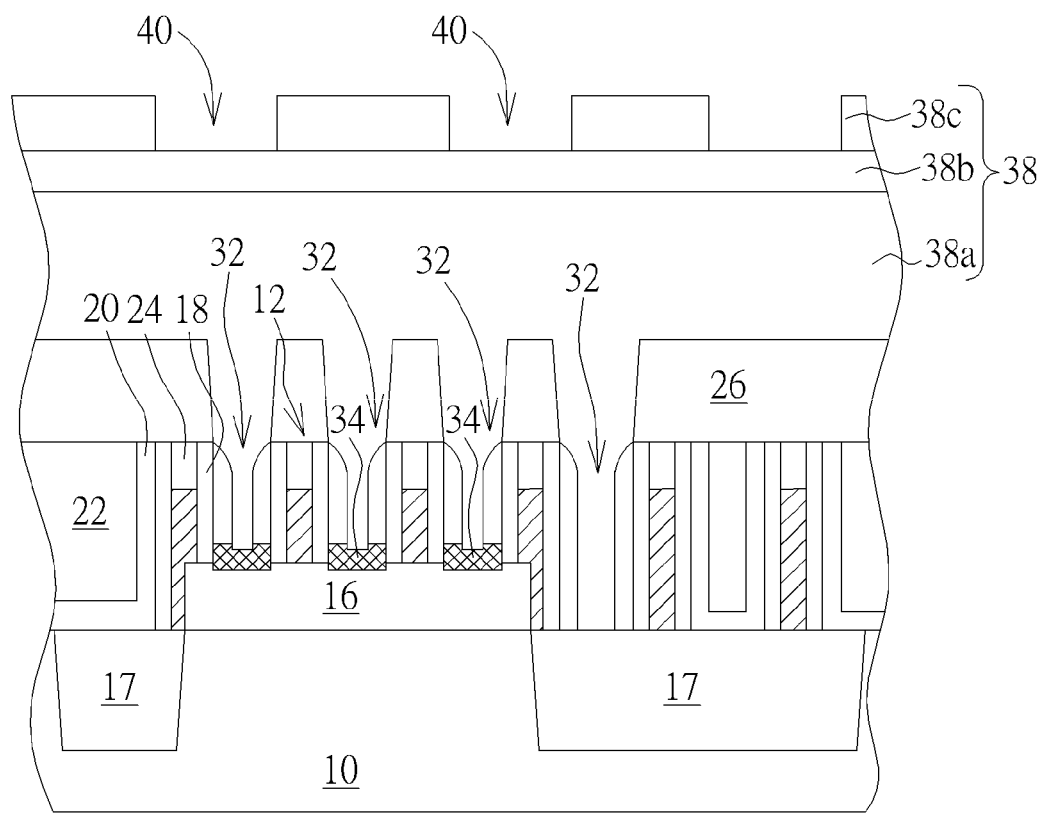

As shown in FIG. 6, a photoresist layer 38 is then formed, wherein the material of the photoresist layer 38 may be the same as the material of the photoresist layer 28, comprising an organic dielectric layer (ODL) 38a, a silicon-containing hard mask bottom anti-reflecting coating (SHB) 38b and a photoresist layer 38c. Afterwards, in order to form the metal plug that is electrically connected to the metal gate 12 (wherein the metal plug can replace the M0 and the lower contacts structure electrically connected to the metal gate in conventional process, denoted here as the $0^{th}$ metal gate contact, M0PY), a photo-etching process is performed to pattern the photoresist layer 38c and to form a plurality of openings 40, wherein each opening 40 is at least disposed correspondingly to the metal gate 12, but not limited thereto. Parts of the opening 40 may be disposed correspondingly to the STI 17.

Figure 7:
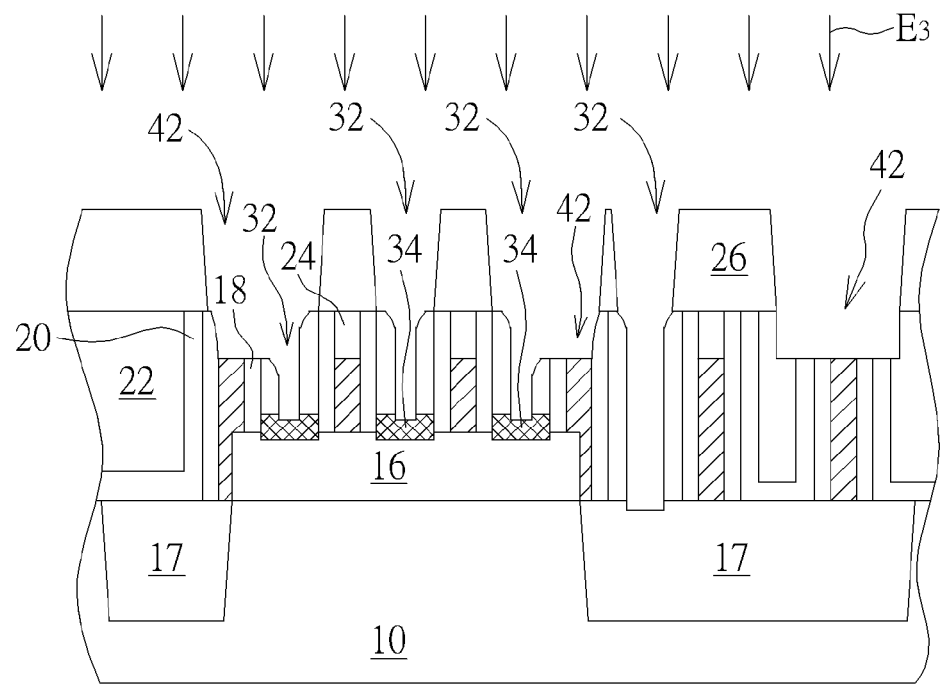

As shown in FIG. 7, an etching process E3 is then performed to transfer the pattern to other layers disposed below, wherein the etching process E3 comprises etching in sequence from top to bottom: the SHB 38b, the ODL 38a, the second dielectric layer 26 and the hard mask 24. It is worth noting that in the etching process E3, the volume ratio of the per fluorocarbon gases to oxygen is adjusted to have an etching rate for etching the silicon nitride similar to the etching rate for etching the silicon oxide. In other words, the etching gas used in the etching process E3 has a low-selectivity for the silicon nitride and silicon oxide (the selectivity is preferably smaller than 5), so the etching gas can therefore remove the silicon nitride and remove the silicon oxide simultaneously. After the etching process E3 is performed, the top of the metal gate 12 can be exposed, besides, a plurality of second trenches 42 can be formed. Afterwards, the remaining photoresist layer and the ODL 38a disposed in the first trenches 32 or in the second trenches 42 can be removed through an ash process or other suitable processes.

Figure 8:
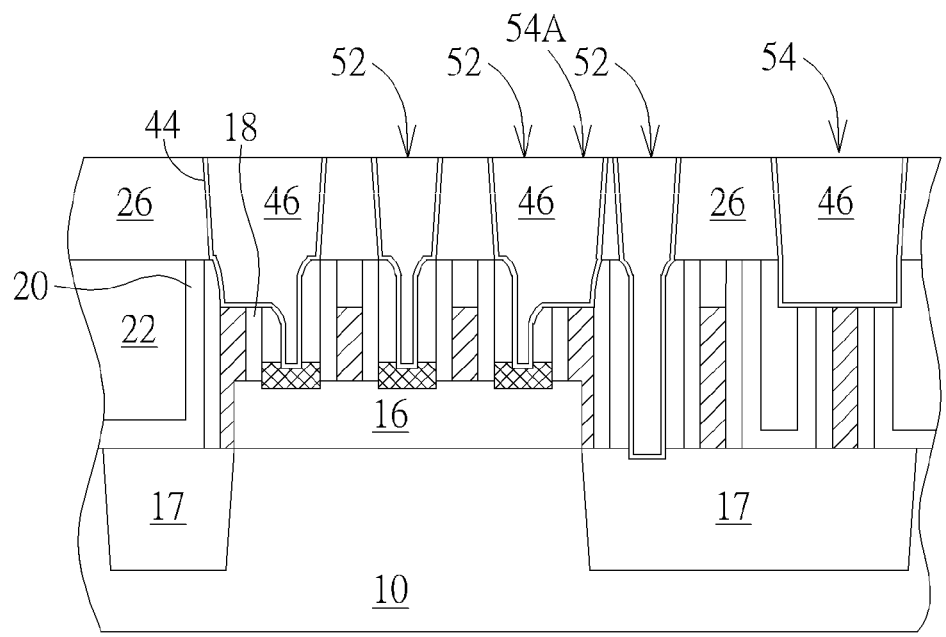

As shown in FIG. 8, a barrier layer 44 and a metal layer 46 are filled in each first trench 32 and each second trench 42 simultaneously, wherein the barrier layer 44 may comprise titanium nitride (TiN), tantalum nitride (TaN) or Ti/TiN multiple barrier layers to improve the adhesivity between the inner surface of each trench and the metal layer formed in the following steps. The metal layer 46 preferably comprises tungsten (W) that has better gap fill performances. A planarization process is then performed to remove the extra barrier layer and the metal layer disposed on the top surface of the second dielectric layer 26 to simultaneously form a plurality of first contacts 52 and a plurality of second contacts 54 in the first dielectric layer 22 and in the second dielectric layer 26, wherein each first contact 52 at least is electrically connected to parts of the S/D region 14 (in other words, the first contacts 52 of the present embodiment are the M0CT mentioned above), each second contact 54 is at least electrically connected to parts of the metal gate 12 (in other words the second contacts 54 of the present embodiment are the M0PY mentioned above). In addition, since the first contacts 52 and the second contacts 54 are filled by the metal layer 46 and completed simultaneously, each first contact 52 and each second contact 54 is a monolithically formed structure. It is worth noting that in the present invention, parts of the second trenches 42 and parts of the first trenches 32 are partially overlapped, so parts of the first contact 52 will be connected to parts of the second contacts 54 (such as the second contact 54A shown in FIG. 8). These connection portions of the first contacts 52 and the second contacts 54 may be used as share contacts of a semiconductor device, but not limited thereto.

Figure 9:
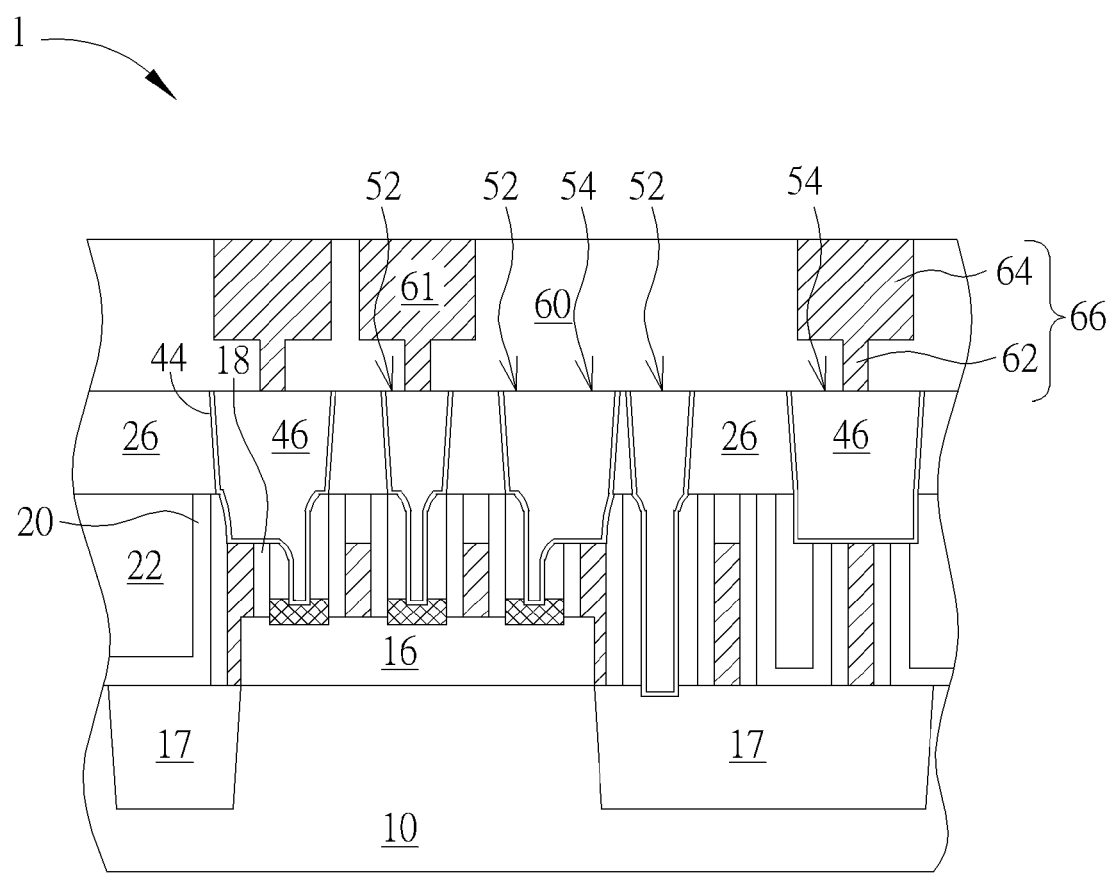

As shown in FIG. 9, a metal interconnect process is performed, comprising forming a third dielectric layer 60 on the top of the second dielectric layer 26, wherein the third dielectric layer 60 is like the inter metal dielectric (IMD) in conventional technology, and forming a plurality of via holes (not shown) and a plurality of trace patterns (not shown) through an etching process or other methods. Finally, a metal layer 61 is simultaneously filled in each via hole and each trace pattern, and a planarization process is performed to remove the extra metal layer on the surface of the third dielectric layer 60 to complete a plurality of via hole structures 62 and a plurality of trace structures 64 simultaneously. In this embodiment, the via hole structures 62 and the corresponding trace structures 64 can be regarded as third contacts 66, wherein each third contact 66 is a monolithically formed structure. Each via hole structure 62 directly contacts the first contacts 52 or the second contacts 54 disposed below along a vertical direction. The trace structures 64 are on a same level, and electrically connected to others elements along a horizontal direction. The via hole structures 62 may have rectangular, circular or other block shapes, and the trace structures 64 may be lines or have striped shapes when viewed from top views, but not limited thereto.

It is worth noting that in the manufacturing process mentioned above, the first trenches 32 are formed before the second trenches 42 are formed, however, the present invention is not limited thereto. In another embodiment of the present invention, a low-selectivity etching gas may be used to form the second trenches 42, and a high-selectivity etching gas is then used to form the first trenches 32. A barrier layer 44 and a metal layer 46 are then filled into the first trenches 32 and the second trenches 42. A planarization process is then performed to complete a plurality of first contacts 52 and a plurality of second contacts 54. This manufacturing sequence should be comprised in the scope of the present invention.

A semiconductor device 1 of the present invention can be formed through the manufacturing process mentioned above, wherein the final structure is shown in FIG. 9. Please refer to FIGS. 1-9. The semiconductor device 1 at least comprises a substrate 10, a first dielectric layer 22 disposed on the substrate 10, a metal gate 12 disposed in the first dielectric layer 22, a S/D region 14 disposed on two sides of the metal gate 12, and a hard mask 24 disposed on the metal gate 12, wherein the top surface of the hard mask 24 and the top of the first dielectric layer 22 are on the same level, a second dielectric layer 26 disposed on the first dielectric layer 22. The present invention further comprises a plurality of first contacts 52 disposed in the first dielectric layer 22 and in the second dielectric layer 26 electrically connected to parts of the S/D region 14, wherein each first contact 52 is a monolithically formed structure, and a plurality of second contacts 54 disposed in the first dielectric layer 22 and in the second dielectric layer 26 electrically connected to parts of the metal gate 12, wherein each second contact 54 is a monolithically formed structure. In addition, the semiconductor device 1 selectively comprises the following components: an epoxy layer 15 disposed on the S/D region 14, a STI 17 disposed in the substrate 10 surrounding the metal gate 12, at least a spacer 18 and at least a CESL 20 disposed on two sides of the metal gate 12, wherein both of the two elements have a truncated top surface, a fin structure 16 disposed on the substrate 10, a salicide layer 34 disposed between each S/D region 14 and each first contact 52, a third dielectric layer 60 disposed on the second dielectric layer 26, and a plurality of third contacts 66 disposed on parts of the first contacts 52 or on parts of the second contacts 54, wherein each third contact 66 is a monolithically formed structure, and each third contact 66 comprises a via hole structure 62 and a trace structure 64, wherein each via hole structure 62 and each trace structure 64 comprise the same material, and contact each other. The other components, material properties, and manufacturing methods of the semiconductor device 1 are similar to those of the first preferred embodiment detailed above and will not be redundantly described.

In summary, the present invention comprises a hard mask on a metal gate, and uses etching gases with different etching rates to selectively etch the hard mask and the dielectric layer disposed above. Therefore, contacts disposed correspondingly to the metal gate and contacts disposed correspondingly to the S/D region can be formed simultaneously, and replace the $0^{th}$ metal layer (M0) and the lower contact structures of conventional process, thereby reducing the manufacturing steps.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device, at least comprising the following steps:
   providing a substrate, wherein a first dielectric layer is formed on the substrate, at least one metal gate is formed in the first dielectric layer and at least one source drain region (S/D region) is disposed on two sides of the metal gate;
   forming a second dielectric layer on the first dielectric layer;

performing a first etching process to form a plurality of first trenches in the first dielectric layer and the second dielectric layer, wherein each first trench exposes each S/D region;

performing a salicide process to form a salicide layer in each first trench; and performing a second etching process to form a plurality of second trenches in the first dielectric layer and the second dielectric layer, wherein each second trench exposes each metal gate.

2. The method of claim 1, further comprising forming a hard mask on the top surface of each metal gate after the first dielectric layer is formed.

3. The method of claim 2, wherein the top surface of the hard mask and the top surface of the first dielectric layer are on the same level.

4. The method of claim 1, further comprising forming at least one fin structure on the substrate.

5. The method of claim 1, wherein parts of the second trenches and parts of the first trenches partially overlap each other.

6. The method of claim 1, further comprising filling a metal layer in each first trench and each second trench simultaneously to form a plurality of first contacts and a plurality of second contacts respectively.

7. The method of claim 6, further comprising forming a plurality of third contacts electrically connected to parts of the first contacts or parts of the second contacts, wherein each third contact is a monolithically formed structure.

8. The method of claim 7, wherein each third contact comprises a via hole structure and a trace structure, wherein the via hole structure and the trace structure comprise the same material and contact each other directly.

9. The method of claim 1, further comprising an etching stop layer disposed on two sides of the metal gate, and the etching stop layer has a truncated top surface.

10. The method of claim 2, wherein when performing the first etching process, the ratio of the etching rate for etching the first dielectric layer to the etching rate for etching the second dielectric layer is larger than 5.

11. The method of claim 2, wherein when performing the second etching process, the ratio of the etching rate for etching the first dielectric layer to the etching rate for etching the second dielectric layer is smaller than 5.

12. The method of claim 1, wherein parts of the metal gate are removed during the formation for forming the second trenches.

\* \* \* \* \*